United States Patent [19]

Coates

[11] 4,308,586
[45] Dec. 29, 1981

[54] METHOD FOR THE PRECISE DETERMINATION OF PHOTORESIST EXPOSURE TIME

[75] Inventor: Vincent J. Coates, Palo Alto, Calif.

[73] Assignee: Nanometrics, Incorporated, Sunnyvale, Calif.

[21] Appl. No.: 146,072

[22] Filed: May 2, 1980

[51] Int. Cl.³ .............................................. G01B 9/02
[52] U.S. Cl. .................................. 364/525; 364/491; 364/571; 356/357
[58] Field of Search ............... 364/525, 488, 489, 490, 364/491, 571, 577; 356/357; 430/30

[56] References Cited

U.S. PATENT DOCUMENTS

| | | | |
|---|---|---|---|
| 3,601,492 | 8/1971 | Reichard | 356/357 |
| 3,824,017 | 7/1974 | Galyon | 356/357 |
| 3,950,170 | 4/1976 | Grosholz | 430/30 |

*Primary Examiner*—Mark E. Nusbaum
*Assistant Examiner*—Gary Chin
*Attorney, Agent, or Firm*—Linval B. Castle

[57] ABSTRACT

A method for determining the precise exposure for a photoresist coating by measuring the coating thickness with a microspectrophotometer that provides data for plotting a nearly sinusoidal curve of percent reflectivity versus wavelength. The nominal exposure derived from the thickness measurement is then corrected to a precise value by extrapolation and normalization of the curve at the photosensitive wavelength of the photoresist.

3 Claims, 3 Drawing Figures

METHOD FOR THE PRECISE DETERMINATION OF PHOTORESIST EXPOSURE TIME

BRIEF SUMMARY OF THE INVENTION

This invention relates generally to photoresist etching processes and particularly to a method for rapidly and accurately determining the proper exposure times for photoresist coatings.

Photoresist is a well-known masking material used extensively, for example, by electronic component manufacturers as a tool in the manufacturing of electronic circuitry. In such an application, a wafer of a substrate material upon which a "printed" integrated circuit pattern is to be applied is coated with the light-sensitive photoresist fluid which, when dry, forms a nearly uniform, thin film on the substrate. A positive metal or photographically produced mask of the required circuitry is subsequently applied to the photoresist surface which is then exposed to radiation that is rich in the particular wavelength to which the photoresist material is sensitive, generally radiation having a wavelength of 405 nm or 435 nm such as produced by a mercury arc source. This radiation produces a chemical change in the exposed areas of the photoresist which is then chemically developed to remove those portions thus exposed. The remaining photoresist then serves as a positive or negative mask for the subsequent etching of the substrate or for the deposition of various electrical circuits or semiconductor components to the substrate surface.

Proper exposure of photoresist film is most critical and, since the photoresist coatings are not easily applied in uniform thickness or constant refractive index, a precise predetermination of proper exposure cannot be made. This results in an unavoidable loss of a significant percentage of costly electronic circuits or chips. If there is a radiation underexposure of the photoresist through the overlying mask, the subsequent development may not actually reveal the surface of the substrate wafer. Conversely, an overexposure will not only result in the desired opening to the substrate surface but reflection from the surface may scatter to exposed undesired photoresist sections lying under the protective overlying mask thereby resulting in an "undercutting" or widening of the desired opening on the substrate.

Assuming a constant known land intensity of the desired wavelength of light, a reasonably accurate, or nominal exposure time for a coated substrate can be determined from a thickness measurement of each photoresist coating. Since thicknesses are imprecise and the refractive index of the photoresist may vary from wafer to wafer, a definite or fixed exposure cannot be used in a production run of several hundred or thousands of circuit chips. Further, if it were possible or practical to measure the thickness of the photoresist coating on each substrate wafer to obtain an approximate or nominal exposure time, the precise exposure is not readily obtainable because radiation inteference by multiple reflection in the photoresist film produce variations in reflectivity from the substrate. That is, for maximum radiation exposure of a sensitized photoresist, there must be a maximum reflectivity from the substrate through the photoresist at the particular wavelength at which the photoresist has its optimum photosensitivity.

The exposure prediction method of the invention employs an automatic film thickness computer such as the commercially available NanoSpec (trademark) manufactured by Nanometrics, Inc., of Sunnyvale, Calif. In this system each photoresist coated substrate (which may be photosensitive at a wavelength of perhaps 405 nm) is rapidly exposed to radiation, but only in the 480 nm to 800 nm band to which the photoresist is insensitive. A microspectrophotometer scans this wavelength range and a wide range photomultiplier detects the light reflected from the surface of the wafer being measured. Interference of a light wave caused by the multiple reflections inside the photoresist film is produced and a plot of the percent of detected light reflectivity from the substrate surface as a function of wavelength results in a near sinusoidal waveform, the frequency of which varies according to the film thickness and the refractive index of the photoresist. It is then a relatively simple operation to match this plotted waveform, either manually or by the system computer, against a previously established standard waveform for photoresists having that particular refractive index and to thereby accurately determine the precise thickness of the photoresist coating. This precise thickness information may then be compared with prior accumulated data to arrive at an approximate or nominal exposure for the photoresist.

The above described process using the well-known microspectrophotometer automatic film thickness computer system in the manner described will yield a relatively close approximation of the precise exposure of the photoresist. The present invention is a further refinement to the above-described method and operates by applying to the above derived approximate or nominal exposure time a correction factor obtained from an extrapolated extension of the sinusoidal reflectivity versus wavelength response curve from the microspectrophotometer computer system. Recognizing, as stated above, that the photoresist cannot be exposed to light that is of the same wavelength to which it is sensitive, and therefore cannot be measured at this wavelength, the present invention allows a determination to be made despite this limitation.

Briefly described, the method of the invention includes the steps of calculating the photoresist film thickness and hence the nominal exposure time by use of the commercially available film thickness computer that provides output data in the form of a nearly sinusoidal waveform representing a plot of percent reflectivity from the photoresist-coated substrate versus radiation wavelength applied to the coating in a wavelength band at which the photoresist is insensitive. The invention comprises the additional steps of extrapolating the sinusoidal curve data to determine the percent reflectivity at the wavelength to which the particular photoresist is sensitive, the difference between 100% and the percent reflectivity thus determined being the required increase in time over the previously derived nominal exposure time to obtain a precise exposure time for the photoresist film.

DESCRIPTION OF THE FIGURES

In the drawings which illustrate various aspects of the invention.

DETAILED DESCRIPTION

Figure 1:
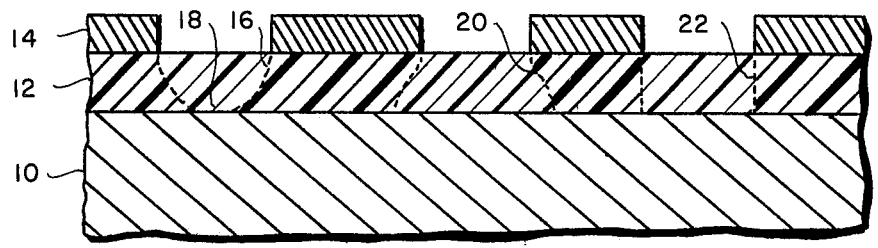
FIG. 1 is a sectional elevation view of a portion of a typical photoresist coated substrate and illustrates the effects of underexposure, overexposure, and correct exposure of the coating.

A precise exposure time of a photoresist through an overlying mask is important in the production of electronic circuitry in order to properly control the width or size of a conductor or component that is to be printed or etched on a substrate surface. FIG. 1 is a sectional elevation view of a substrate wafer 10 that has been coated with a thin layer of photoresist 12. So that the photosensitive photoresist may be safely handled in a subdued light normally rich in the longer wavelength radiation, it is specifically manufactured to be photosensitive to some specific radiation frequency or band usually in the violet or ultraviolet end of the visible light spectrum. Therefore, since the mercury arc provides a readily obtainable intense source of short wavelength of radiation, photoresist is often designed to have a photo-sensitive peak at wavelengths of 405 nm or 435 nm. The photoresist 12 is covered with an overlying mask 14 containing apertures representing conductors or components and radiation at the proper wavelength is projected through the mask to expose the underlying layer of photoresist 12.

After exposure through the mask 14, the photoresist 12 is chemically developed and the previously exposed portions are thus removed to reveal a surface on the substrate 10 that conforms to the apertures in the mask 14. If, however, the radiation exposure applied to the photoresist 12 is insufficient to intensity or time, only the top portion of the photoresist 12 may be exposed as indicated by the dashed line 16. Therefore, upon subsequent development of the photoresist, the photoresist may not be completely removed or may reveal a very narrow line on the surface of substrate 10 as indicated at 18.

If, on the other hand, the photoresist 12 is exposed for an excessive time or with excessive radiation, the radiation may spread beneath the overlying mask 14 as indicated by the dashed line 20 and upon subsequent development, the resulting area on the surface of the substrate 10 will be excessively wide. It is therefore necessary to properly expose the photoresist 12 as shown by the dashed line 22, so that upon subsequent development, the area revealed on the substrate 10 conforms to the overlying aperture in the mask 14.

Proper exposure of a layer of photoresist depends upon both the thickness of the photoresist layer and the intensity of the applied radiation. By the appropriate use of the voltage regulators, radiation intensity may be held very constant so that the only remaining variable to be measured is the thickness of the photoresist layer. This measurement is not readily obtainable with conventional measuring devices and is most accurately determined by optical measuring devices. Furthermore, since it is virtually impossible to apply photoresist coatings of constant thickness to even a small production run of substrate wafers, it is necessary that the optical thickness measuring system be capable of very rapidly measuring the film thickness so that each coated wafer may be individually measured.

Figure 2:
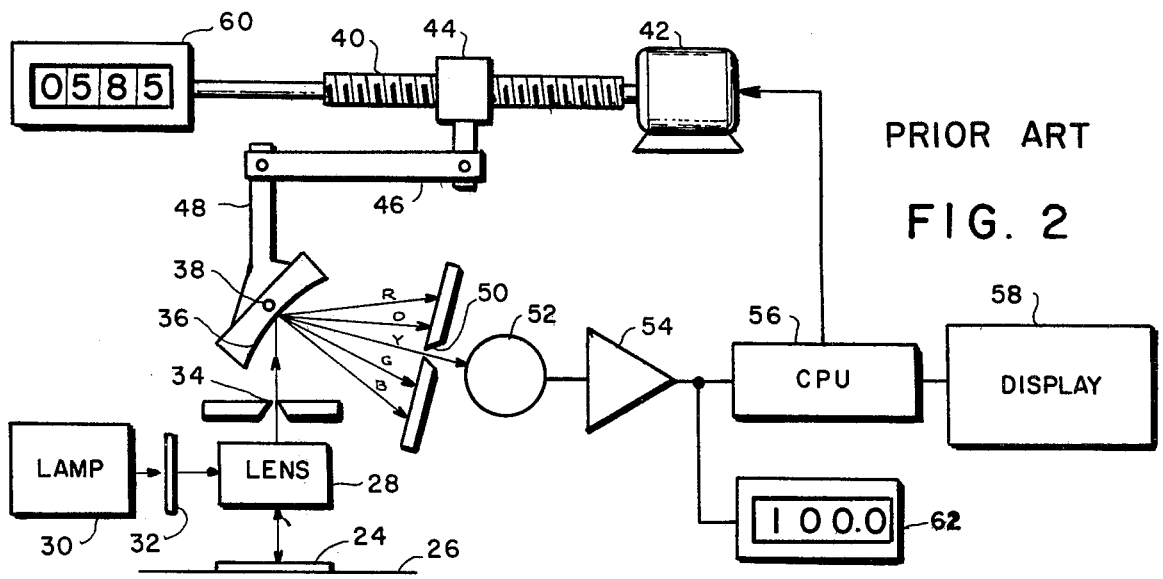
FIG. 2 is a schematic block diagram of a typical commercially available microspectrophotometer type of film thickness computing system.

FIG. 2 is a schematic block diagram of a typical automatic film thickness computing system such as the aforementioned NanoSpec manufactured by Nanometrics, Inc. of Sunnyvale, Calif. In FIG. 2, a photoresist coated substrate wafer 24 on a suitable conveyor 26 is passed beneath an optical microscope lens system 28. The lens system 28 includes reflecting means so that radiation originating at the lamp 30 and passing through the filter 32 is projected to the photoresist coating. Filter 32 is selected so that the radiation band to which the photoresist is most sensitive is eliminated, and in a typical photoresist sensitive to radiation at 435 nm, the filter 32 will reject all radiation having a shorter wavelength than perhaps 480 nm.

The reflection from the coated substrate 24 is magnified by a microscope lens in the system 28 and passes through the microspectrophotometer entrance aperture 34 to a holographic grating 36. The holographic grating 36 is rotatable about a pivot 38 through a small arc by the rotation of a lead screw 40 that is driven by a stepping motor 42. A traveling nut 44 engaging the lead screw 40 is pivotally coupled to a link 46 which, in turn, is coupled to an arm 48 attached to the holographic grating 36. Thus, operation of the stepping motor 42 will rotate the lead screw 40 to linearly drive the traveling nut 44 that rotates the grating 36 through the linkage and arm 46 and 48.

The light rays reflected from the coated substrate 24 that pass through the entrance apertures 34 strike the grating 36 and are diffracted therefrom against the exit aperture 50 of the microspectrophotometer. The particular color or light wave passing through the aperture 50 is detected by a photomultiplier detector 52, the output of which is amplified by the amplifier 54 and applied to a computer 56 which stores for later analysis the intensity of radiation for each wavelength scanned by rotation of the holographic grating 36. The computer 56 also controls the operation of the stepping motor 42 and the rotation of the lead screw 40 in order to determine the wavelength measured by the detector 52. For the convenience of the operator, the lead screw 40 may be coupled to a conventional mechanically operated counter 60 that displays the wavelength being measured. Further, to provide an indication of photointensity output from the detector 52, a photointensity meter 62 may be coupled to the output of the amplifier 54. First, a wavelength background scan of a bare substrate without resist is stored in the computer memory step-by-step.

A plotter or display 58 coupled to the computer 56 is used to plot a curve of the ratio of reflectivity of coated substrate 24 to the background measured by detector 52 at each stepped wavelength of the radiation thus detected. This produces a reflectivity curve free of background artifacts. In the thickness measurement of very thin films, such as a photoresist coating, the plotted curve is sinusoidal, the frequency of which is a function of film thickness and its refractive index. With knowledge of the refractive index, a precise thickness of a film may thus be measured.

It must be stressed that the apparatus described above in connection with FIG. 2 is a well-known commercially available automatic film thickness computing system such as the previously mentioned NanoSpec thickness computing system. This prior art system is described herein because the inventive method requires the use of a film thickness computing system of this type.

The steps of the present invention pick up the prior art at this point and provide a precise exposure for each photoresist coated substrate wafer passing under the lens of the microspectrophotometer.

Figure 3:
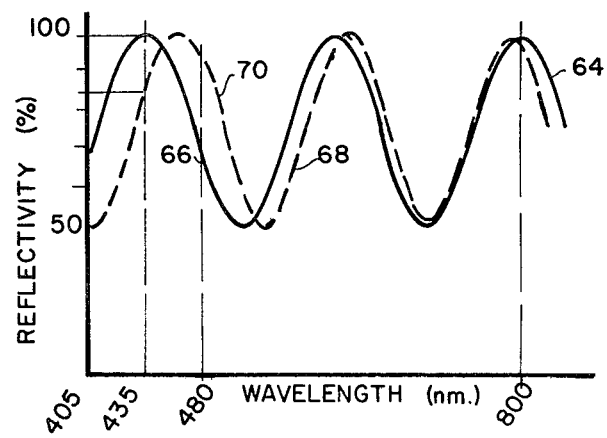
FIG. 3 is a graph illustrating curves of percent reflectivity versus wavelength for two samples of photoresist having different film thicknesses or refractive index.

Since the photoresist material is photosensitive in the blue-violet range of the spectrum, it is exposed to radiation between approximately 480 nm to 800 nm. The computer 56 which can readily be programmed to determine the frequency of the sinusoidal wave 64 in the wavelength range of 480–800 nm and which can therefore accurately measure the thickness of the photoresist film on the substrate 24 can, in addition, extrapolate the data to develop an extended sinusoidal waveform section 66 in a wavelength band shorter than 480 nm, as illustrated in FIG. 3. If, by chance, this extrapolated section 66 displays a peak of 100% reflectivity at an optimum photoresist exposure frequency of 435 nm, the nominal or approximate exposure time for the photoresist coating will be precise and no further adjustments would be necessary for a proper exposure. Thus, for a precise exposure, the reflectivity must be at its maximum or 100% at the optimum photosensitive frequency of the photoresist which in FIG. 3 is presumed to be 435 nm.

Let it now be assumed that the next photoresist coated substrate chip passing beneath the lens assembly 28 of FIG. 2 produces a sinusoidal response curve 68 illustrated by the dashed waveform of FIG. 3. The frequency of curve 68 is greater than that of the waveform 64 and therefore represents a photoresist thickness somewhat thinner than that which produced the waveform 64. When the computer 56 extrapolates the data represented by curve 68 to derive reflectivity data below the wavelength of 480 nm, it is found that the extrapolated portion 70 has a reflectivity peak at approximately 455 nm and that it crosses the photosensitive frequency of 435 nm at the reflectivity point of approximately 84%.

In order to correct the nominal exposure time to obtain a precise exposure time, it is necessary to add to the nominal exposure time a percentage equal to the difference between 100% reflectivity and the percent value at which the response curve crosses the vertical line representing the wavelength of maximum photosensitivity of the photoresist film. Thus, if the photoresist film that results in the dashed waveform 68 is photosensitive at 435 nm, it can be seen that the extrapolated section 70 crosses the 435 nm line at a reflectivity of 84%. Since the difference between 100% and 84% is 16%, the nominal exposure time derived from the frequency of the curve 68 must be increased by 16% to obtain a precise exposure time. If, on the other hand the photoresist film would be photosensitive at 405 nm, it can be seen that the extrapolated portion 70 of the curve 68 is at a reflectivity level of approximately 50%. In such a case, the nominal exposure time must be increased by an additional 50% to obtain the precise exposure time.

It is quite apparent that the computer 56 in the commercial film thickness computer system of FIG. 2 may readily be programmed to plot an extrapolated waveform 70 and, at the photosensitive frequency of the particular photoresist being measured, normalize the reflectivity at this point to 100%, the amount of normalization necessary being the required increase in exposure time to obtain a precice exposure of the photoresist without danger of under exposure or over exposure as discussed in connection with FIG. 1.

Having thus described my invention, what is claimed is:

1. A method for determining the precise exposure for a photoresist coating on a substrate material, said method comprising the steps of:

measuring the precise thickness of the photoresist coating with a thickness computing system that scans said coating in a radiation band in which said coating is substantially insensitive, said computing system providing output data in the form of a plotted curve of percentage reflectivity versus wavelength, said curve having nearly sinusoidal variations in reflectivity as a function of wavelength, the frequency of said variations being a function of refractive index and the precise thickness of said coating, said combination of refractive index and thickness being a measure of the approximate correct exposure for said coating;

extrapolating said curve to extend into the radiation band containing the optimum photosensitive wavelength of said photoresist coating;

determining from said extended curve the value of reflectivity at the point said curve intersects said optimum photosensitivity wavelength;

computing the percentage increase necessary to raise said determined value of reflectivity to the maximum reflectivity of said plotted curve; and increasing said approximate correct exposure of said coating by said computed percentage increase to obtain the prrecise exposure of said coating.

2. A method for determining the precise exposure for a photoresist coating on a substrate material, said method comprising the steps of:

illuminating the photoresist coating with radiation in wavelength band in which said coating is substantially insensitive;

scanning the radiation reflected from said illuminated coating with a microspectrophotometer having a holographic grating for diffracting a narrow incident ray to the exit aperture of said microspectrophotometer, the arcuate position of said grating representing the wavelength of the diffracted ray passing through said aperture;

measuring the intensity of radiation passing through said aperture to obtain a value proportional to reflectivity from said coating at the wavelength of said diffracted ray; and plotting a curve of percentage reflectivity versus wavelength, said curve having sinusoidal variations in reflectivity as a function of wavelength, the frequency of said variations being a function of refractive index and the precise thickness of said photoresist coating, said combination of refractive index and thickness being a measure of the approximate correct exposure of said coating;

the improvement comprising the additional steps of:

extrapolating said plotted curve to extend into the radiation band containing the optimum photosensitive wavelength of said photoresist coating;

determining from said extended curve the value of reflectivity at the point said curve intersects said optimum photosensitivity;

computing the percentage increase necessary to raise said determined value of reflectivity to the maximum reflectivity of said plotted curve; and increasing said approximate correct exposure of said coating by said computed percentage increase to obtain the precise exposure of said coating.

3. The method claimed in claims 1 or 2 wherein the value of maximum reflectivity in said plotted curve is 100% reflectivity and wherein the difference between 100% and said determined value represents said computed increase.

* * * * *